United States Patent [19]
Takeuchi et al.

[11] Patent Number: 5,386,190
[45] Date of Patent: Jan. 31, 1995

[54] SELECTIVE EXCITATION METHOD OF NUCLEAR SPINS IN MAGNETIC RESONANCE IMAGING AND MRI APPARATUS USING THE SAME

[76] Inventors: Hiroyuki Takeuchi, 22-4, Toyogamicho, Kashiwa-shi; Katsunori Suzuki, 682-2, Abiko, Abiko-shi, both of Japan

[21] Appl. No.: 209,486

[22] Filed: Mar. 14, 1994

Related U.S. Application Data

[63] Continuation of Ser. No. 922,474, Jul. 31, 1992, abandoned.

[30] Foreign Application Priority Data

Jul. 31, 1991 [JP] Japan .................. 3-213165

[51] Int. Cl.$^6$ ........................................ G01R 33/20
[52] U.S. Cl. ........................ 324/309; 128/653.2
[58] Field of Search ............ 324/309, 307, 300, 306; 128/653.2, 653.5

[56] References Cited

U.S. PATENT DOCUMENTS

| | | | |
|---|---|---|---|
| 4,665,367 | 5/1987 | Kramer | 324/309 |
| 4,746,863 | 5/1988 | Crooks et al. | 324/314 |
| 4,800,494 | 1/1989 | Foxall | 324/309 |
| 4,862,085 | 8/1989 | Aubert et al. | 324/315 |
| 4,878,499 | 11/1989 | Suzuki et al. | 324/309 |
| 5,167,232 | 12/1992 | Parker et al. | 324/309 |
| 5,225,779 | 7/1993 | Parker et al. | 324/306 |
| 5,298,862 | 3/1994 | Hennig | 324/309 |

FOREIGN PATENT DOCUMENTS

| | | |
|---|---|---|
| 0265956 | 5/1988 | European Pat. Off. . |
| 3135335 | 8/1983 | Germany . |
| 3604281 | 8/1987 | Germany . |
| 3803052 | 8/1988 | Germany . |
| 3729306 | 3/1989 | Germany . |
| 63109847 | 11/1991 | Japan .............. G01N 24/08 |

*Primary Examiner*—Kenneth A. Wieder
*Assistant Examiner*—Raymond Y. Mah
*Attorney, Agent, or Firm*—Antonelli, Terry, Stout & Kraus

[57] ABSTRACT

A slice selective excitation method of nuclear spins in an MRI apparatus comprising applying a first gradient magnetic field $(B+G_{s1})$ to a patient in a predetermined direction, exciting nuclear spins in a first slice selection region of the patient by a first radio frequency pulse, applying then a second gradient magnetic field $(B+G_{s2})$ different from the first gradient magnetic field $(B+G_{s1})$ in the predetermined direction, exciting a second slice selection region overlapping at least partially with the first slice selection region by irradiating thereto a second radio frequency pulse so as to excite once again the nuclear spin excited by the first radio frequency pulse, and generating NMR signals effective for image reconstruction from only the overlapping portion of the slice selection regions.

19 Claims, 5 Drawing Sheets

SELECTIVE EXCITATION METHOD OF NUCLEAR SPINS IN MAGNETIC RESONANCE IMAGING AND MRI APPARATUS USING THE SAME

This application is a continuation of Ser. No. 07/922,474, filed Jul. 31, 1992, now abandoned.

BACKGROUND OF THE INVENTION

This invention relates to a selective excitation method of nuclear spins inside a patient in a magnetic resonance imaging for obtaining a tomogram of the patient by utilizing nuclear magnetic resonance (NMR) and an MRI apparatus using the method. More particularly, the present invention relates to an art of removing artifacts on the tomogram resulting from admixture of signals from portions of a patient positioned outside a homogeneous static magnetic field space region into signals inside a slice plane.

An MRI apparatus must separate NMR signals from an inspection object to signals corresponding to respective positions inside the inspection object and must identify them, respectively. To this end has been employed a method which makes the intensity of a magnetic field, in which each portion of the object is placed, different from others so as to make different a resonance frequency of a nuclear spin inside the inspection object and its dephase quantity, and picks up detection signals after position data are applied to them.

To obtain a tomogram of a human body in an arbitrary direction, the MRI apparatus uses a magnet for generating a static magnetic field having an intensity as high as from 0.05 to 2 Tesras with homogeneity of some dozens of parts-per-million (ppm) in a broad spherical space region having a diameter of as great as from 30 to 50 cm. Unlike the homogeneous magnetic field region described above, however, the magnetic field intensity drops or rises and becomes heterogeneous in the space outside the homogeneous magnetic field region of the 30–50 cm spherical space.

Since the homogeneous magnetic field space inside the static field generation magnet exists only inside the spherical space having a diameter of 30 to 50 cm as described above, a certain portion or portions of the patient inevitably protrude from the homogeneous magnetic field space when the patient is placed into the space of the static magnetic field generation magnet for imaging.

If a pulse sequence of applying a radio frequency (RF) pulse of a frequency $f_1$ is executed for imaging under this state, not only a nuclear spin inside an imaging plane, i.e. a slice plane 51 of the patient, but also a nuclear spin inside a certain plane 52 of the patient outside the homogeneous magnetic field space are excited simultaneously and selectively when the nuclear spin inside the slice plane 51 is excited selectively as shown in FIG. 1. Accordingly, the signal from this outside portion is detected simultaneously with the signal from inside the slice plane, appears as an artifact on an image reconstructed, and reduces image quality of the resulting tomogram.

Recognition of the existence of this problem and one of the methods of solving the problem are already disclosed in JP-B-3-74100. Therefore, though the explanation in detail of the causes for the occurrence of artifacts and the method of solving them are hereby omitted, the method disclosed in this reference leaves the following problems yet to be improved.

The MRI apparatus has an excellent advantage that a tomogram of a patient in an arbitrary direction can be obtained noninvasively, but involves the problem that an imaging time is long. However, the technique disclosed in the reference described above must add a pulse sequence portion for removing artifacts to an original imaging pulse sequence, so that the imaging time becomes further elongated. The elongated time itself is generally in the order of 10 to 20 ms for measurement of the imaging time of one slice plane. However, if this method is applied to a multi-slice measuring method used frequently in the MRI apparatus and if imaging is to be completed within a predetermined time, the number of slices must be decreased. The proportion of this decrease is about 20% to 40%, though depending on the pulse sequence for imaging. Therefore, the measurement cannot be finished by a single measurement but must be repeated twice, so that a processing capacity of a patient (through-put) drops.

The second problem is as follows. According to the method of the reference described above, the nuclear spin of the portion of the patient outside the homogeneous static magnetic field region is excited without applying the gradient magnetic field prior to the pulse sequence for imaging. However, since such a portion has generally a greater volume than the ordinary imaging slice plane, it becomes a greater load to a power amplifier for RF pulses. For this reason, a power amplifier having a high output is necessary. To excite the artifact generation portions, a frequency band width must be made greater by at least ten times than for the excitation of the slice plane, and in this aspect, too, any improvement has been desired.

SUMMARY OF THE INVENTION

In view of the problems described above, the present invention aims at providing a novel selective excitation method of a slice plane of MR imaging, at preventing the occurrence of artifacts by applying the selective excitation method to an MRI apparatus, and at improving through-put without the necessity for increasing the size of a power amplifier for generating RF pulses.

To accomplish the objects described above, the present invention comprises a first step of applying a first gradient magnetic field $(B+G_{s1})$ to a patient in a predetermined direction, and exciting a nuclear spin of a predetermined object portion of the patient by a first RF pulse $f_1$ of a magnetic resonance frequency corresponding to the magnetic field intensity of the predetermined object portion of the patient, and a second step of applying a second gradient magnetic field $(B+G_{s2})$ different from the first magnetic field $(B+G_{s1})$ in the predetermined direction after this first step, and further exciting the nuclear spin of the predetermined object portion, which is excited at the first step, by irradiating a second RF pulse $f_2$, in order to effect selective excitation of a slice plane 31 in an MRI apparatus as shown in FIG. 3.

Since the static magnetic field becomes lower at the end of the gradient magnetic field, the magnetic field becomes non-linear as shown in FIG. 3. As a result, two portions corresponding to the same frequency exists. In other words, the portions corresponding to $x_1$ and $x_2$ are excited by the first RF pulse $f_1$ and the portions corresponding to $x_1$ and $x_3$ are excited by the second RF frequency $f_2$.

However, only the nuclear spins which are present in the portion corresponding to $x_1$ and excited by both of the first and second RF pulses $f_1$ and $f_2$ generate an NMR signal effective as an image signal, and artifacts do not occur if this signal is measured and an image is reconstructed.

To carry out the slice selection method embracing the first and second steps described above, the first and second RF pulses have mutually different frequencies or the same frequency depending on setting of the slice plane.

Furthermore, the slice selection regions of the first and second RF pulses irradiated at the first and second steps, respectively, overlap at least partially with each other, or one of the slice selection regions is contained in the other, so that only the nuclear spin at the overlapping portion contributes to the generation of the NMR signal.

The present invention described above provides the following effects. Since the nuclear spin of the same slice portion of the patient is excited by changing the gradients of the gradient magnetic fields of the first and second steps, the nuclear spin of the same portion outside the homogeneous region of the static magnetic field is not excited in superposition between the first and second steps, and artifacts do not occur. The method of the present invention need not execute the additional pulse sequence for exciting the nuclear spin outside the homogeneous region of the static magnetic field but executes the pulse sequence for imaging as RF pulse irradiation. Accordingly, the method of the present invention can drastically shorten the imaging time in comparison with the prior art method. Furthermore, since the method of the present invention does not excite nuclear spins of great volume portions outside the homogeneous region of the static magnetic field, a compact power amplifier for the RF pulse can be employed.

The method of the present invention can excite selectively an arbitrary slice plane by making the frequency of the RF pulse at the first step different from that of the second step.

Since only the overlapping portion of the frequency band width of the RF pulses of the first and second steps becomes a slice thickness, freedom of setting of the slice thickness can be improved.

DESCRIPTION OF THE PREFERRED EMBODIMENTS

Figure 1:
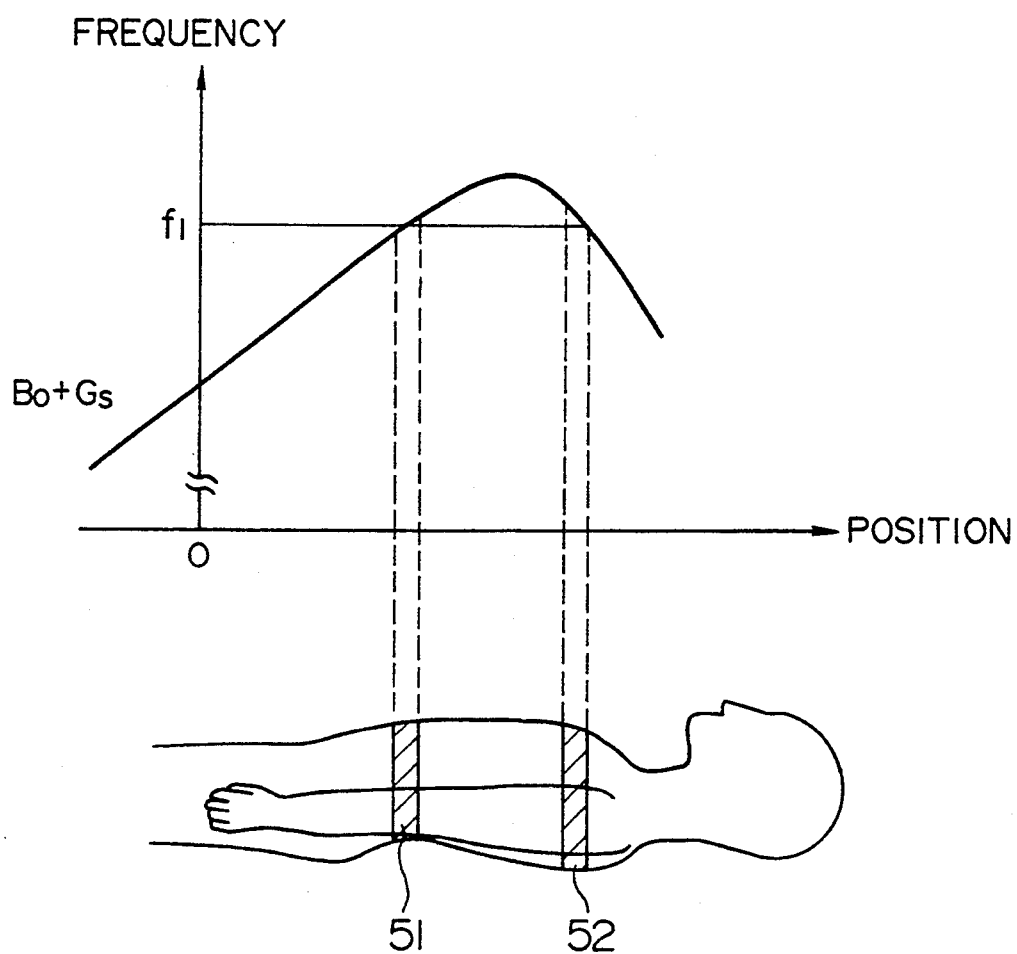
FIG. 1 is a diagram showing causes for the occurrence of artifacts.
Figure 2:
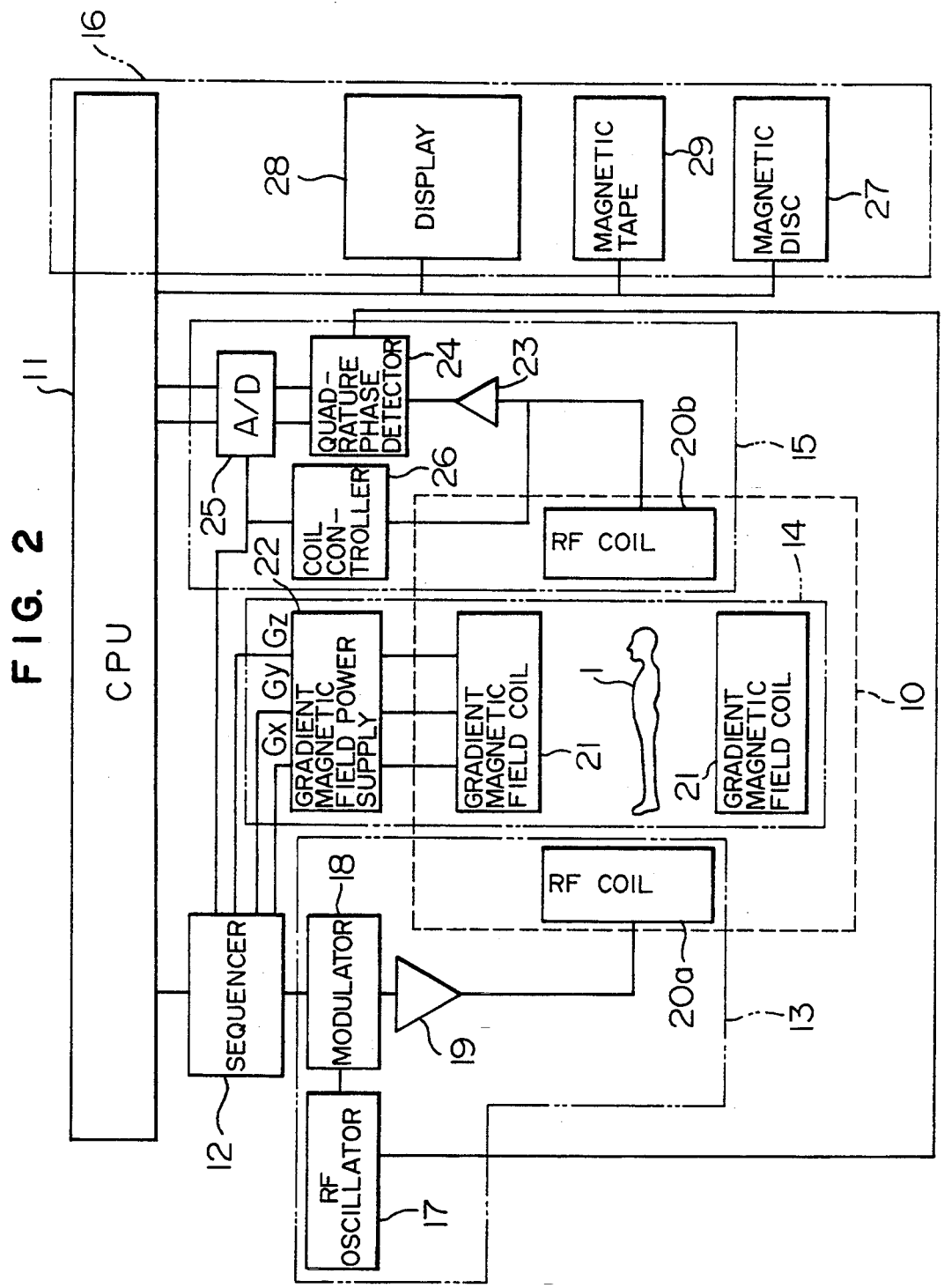
FIG. 2 is a schematic structural view of an MRI apparatus.

Hereinafter, a preferred embodiment of the present invention will be explained with reference to FIGS. 2 to 7. FIG. 2 is a schematic structural view of an MRI apparatus. The MRI apparatus comprises a static magnetic field generation magnet 10, a central processing unit (CPU) 11, a sequencer 12, a transmitter unit 13, a gradient magnetic field system 14 and a signal processing system 16.

A permanent magnet, a resistive magnet or a superconductive magnet can be used for the static magnetic field generation magnet 10 so long as it can generate a strong and homogeneous static magnetic field in a predetermined region inside a space capable of storing a patient 1. The sequencer 12 operates under the control of the CPU 11, and sends various instructions to the transmitter unit 13, the gradient magnetic field system 14 and the receiver unit 15 to obtain tomographic data from the patient 1.

The transmitter unit 13 comprises a radio frequency (RF) oscillator 17, a modulator 18, an RF amplifier 19 and an RF coil 20a on the transmission side. The modulator 18 amplitude-modulates an RF pulse outputted from the RF oscillator 17 in accordance with the instruction from the sequencer 12. This amplitude-modulated RF pulse is amplified by the RF amplifier 19 and is supplied to the RF coil 20a disposed in the proximity of the patient 1 in the static magnetic field space so that an electromagnetic wave can be irradiated from the RF coil 20a to the patient 1.

The gradient magnetic field system 14 comprises a gradient magnetic field coil wound in three-axes directions X, Y, Z, and a gradient magnetic field power supply 22 for driving the coil of the gradient magnetic field coil 21 in each of the X, Y and Z direction. When the gradient magnetic field power supply of each coil is operated by the instruction from the sequencer 12, the gradient magnetic field $G_x$, $G_y$, $G_z$ is generated in each of the X, Y and Z directions. These gradient magnetic fields $G_x$, $G_y$, $G_z$ are irradiated to the patient 1 and are used for setting a slice plane and for providing position data to the nuclear spin inside the patient 1.

The receiver unit 15 comprises an RF coil 20b on the reception side, an amplifier 23, a quadrature phase detector 24 and an A/D (analog-to-digital) convertor 25. A response electromagnetic wave (NMR signal) of the nuclear spin inside the patient 1 excited by the electromagnetic wave irradiated from the RF coil 20a on the transmission side is detected by the RF coil 20b on the reception side disposed close to the patient 1 inside the static magnetic field, and its detection signal is amplified by the amplifier 23. The amplified signal is converted to two series of waveform-shaped signals by the quadrature phase detector 24 which is controlled by the output signal of the RF oscillator 17, and these signals are converted to digital signals by the A/D converter 25 at the timing instructed by the sequencer 12 and are outputted to the signal processing system 16.

The signal processing system 16 comprises the CPU 11, a recording unit such as a magnetic disk 27 and a magnetic tape device 29, and a display unit 28 such as a CRT. This system executes various processing of the signal from the receiver unit 15 such as Fourier transform, arithmetic operation of correction coefficients, image reconstruction, and so forth, displays the image of the density distribution of the atomic nuclei in the slice plane of the patient 1 such as a hydrogen proton density distribution image, a $T_1$ stressed image representing the behaviour of the nuclear spin (relaxation time), a $T_2$ stressed image, etc, on the display unit 28, and stores the image data in the recording unit.

Figure 3:
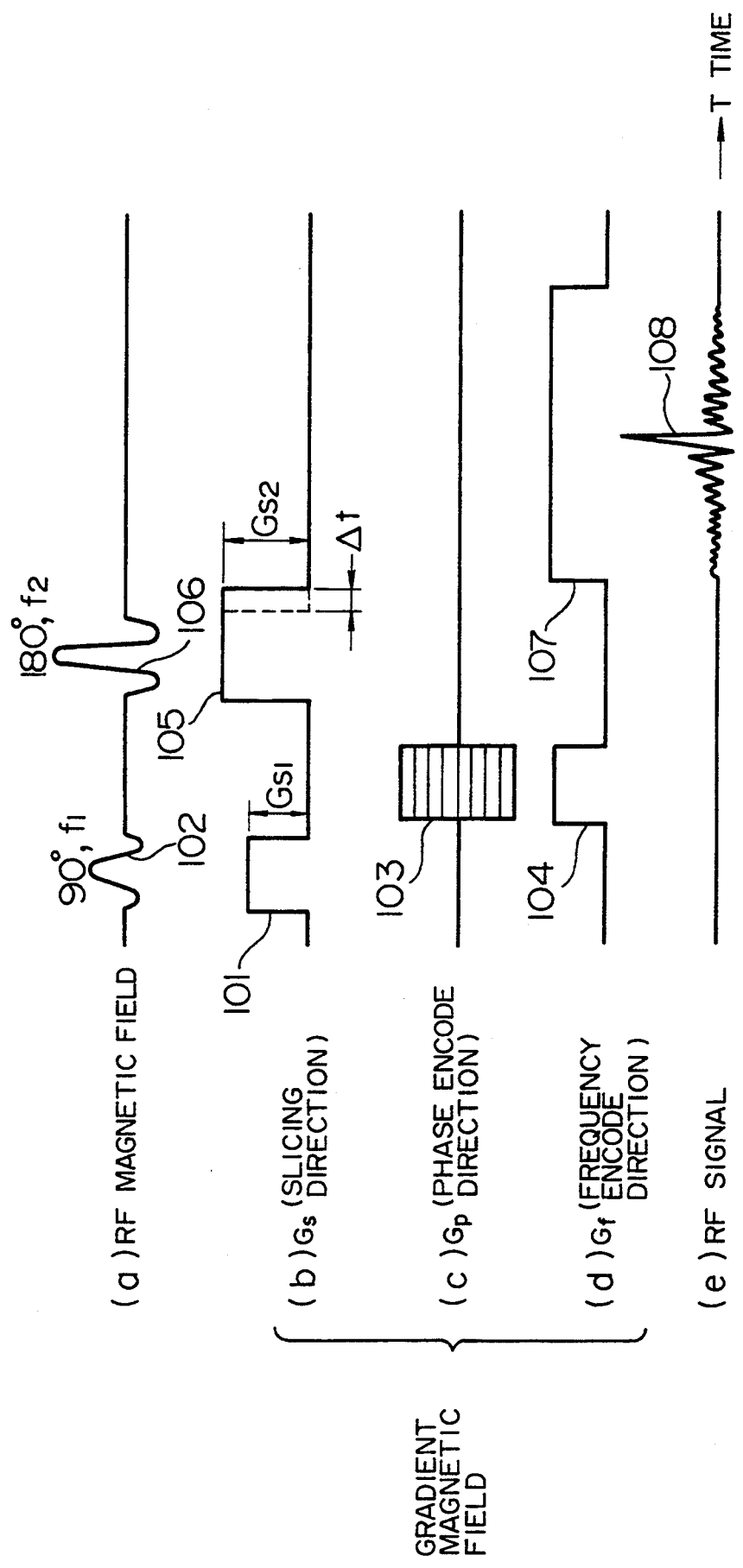
FIG. 3 is a diagram showing an example where a selective excitation method of nuclear spins according to the present invention is applied to a pulse sequence of a spin echo method.

Next, the pulse sequence for selective excitation of the nuclear spin in the MRI apparatus having the construction described above, inclusive of the features of the present invention, will be explained about a spin echo method (hereinafter referred to as the "SE method") as a typical method of two-dimensional Fourier transform, by way of example. FIG. 3 shows its pulse sequence. In this diagram, the abscissa represents a time and the ordinate represents the magnetic field intensity as well as the signal intensity. FIG. 3(a) shows the RF magnetic field (hereinafter referred to as the "RF pulse") irradiated from the RF coil 20a on the transmission side to the patient 1 and FIG. 3(b) shows the gradient magnetic field $G_s$ which is applied in one of the three-axes directions X, Y and Z, is superposed with the strong and homogeneous static magnetic field generated by the static magnetic field generation magnet 10, and generates a gradient magnetic field in the region inside the static magnetic field space. Since this gradient magnetic field $G_s$ is applied in the direction which sets the imaging position of the patient 1, i.e. the slice plane, it is generally referred to as a "slicing direction gradient magnetic field". FIG. 3(c) shows the gradient magnetic field $G_p$ to one of the two orthogonal axes inside the slice plane, and its intensity is changed step-wise whenever the sequence shown in FIG. 3 is iterated. It is generally referred to as a "phase encode gradient magnetic field". FIG. 3(d) shows the gradient magnetic field $G_f$ which is applied in the direction orthogonal to the direction of application of the phase encode gradient magnetic field $G_p$, Whereas the phase encode gradient magnetic field $G_p$ provides the phase data to the nuclear spin inside the patient 1 to identify the position of the nuclear spin, this gradient magnetic field $G_f$ provides the frequency data to the nuclear spin to identify the position of the nuclear spin. Generally, this gradient magnetic field is applied at the time of detection of the frequency encode gradient magnetic field or the NMR signals (echo signals) and is therefore referred to as a "readout direction gradient magnetic field". FIG. 3(e) shows an RF signal (spin echo signal) which is detected by the RF coil 20b when the nuclear spin returns from the excited state to the steady state.

Figure 4:
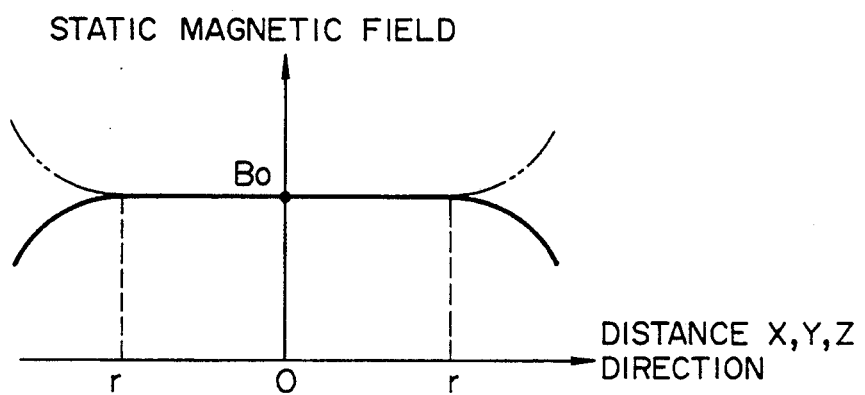
FIG. 4 is an explanatory view useful for explaining a static magnetic field generated in a static magnetic field generation magnet.

Next, the principle of selective excitation of the nuclear spin inside the patient 1 in the present invention will be explained with reference to FIGS. 4 to 7. FIG. 4 shows an example of the distribution of the static magnetic field intensity. generated by the static magnetic field generation magnet 10. In FIG. 4, the abscissa represents the distance inside the magnetic field space and the ordinate represents the static magnetic field intensity B. In the MRI apparatus, a region of a strong static magnetic field intensity $B_o$ which is substantially homogeneous in a certain direction is generated inside a space having a radius r from a certain point, such as a substantial center of the magnetic field space of the static magnetic field generation magnet 10 as the center 0. The static magnetic field intensity B is lower or higher than $B_o$ outside the spherical region of the distance r from the origin 0. In the MRI apparatus according to the present invention, the patient 1 is placed inside such a static magnetic field space and the SE method pulse sequence shown in FIG. 3, for example, is executed. In FIG. 3, the slice direction gradient magnetic field $G_{s1}$ 101 is first applied in order to set the slice position of the patient 1 and then a 90° RF pulse 102 having a predetermined band width for exciting by 90° the nuclear spin inside the slice plane having a predetermined thickness is applied.

Figure 5A:
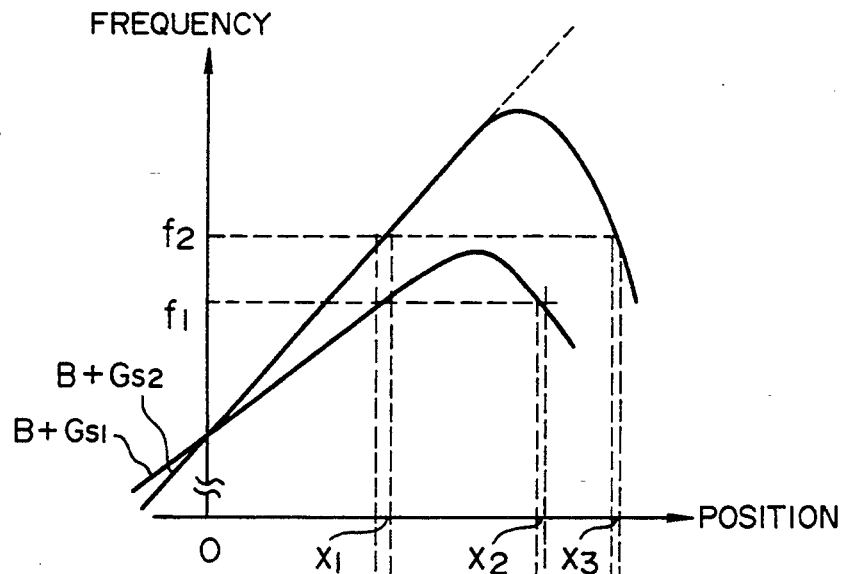
FIGS. 5A and 5B are diagrams useful for explaining the principle of the slice selective excitation method according to the present invention.
Figure 5B:
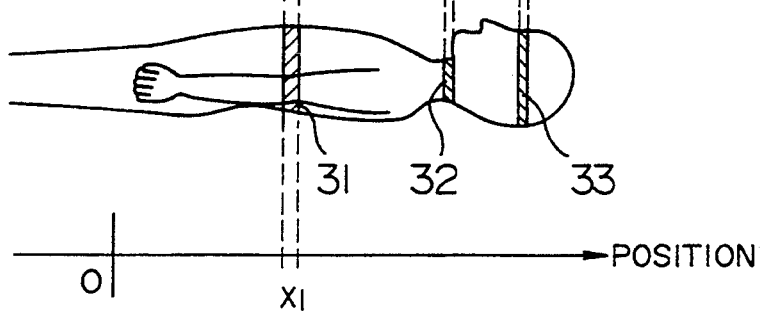

The slice direction gradient magnetic field $G_{s1}$ 101 is superposed with the gradient magnetic field generated by the slice direction gradient magnetic field magnet and having a gradient $G_{s1}$ and the static magnetic field B generated by the static magnetic field generation magnet 10. In this case, the magnetic field at the position at which the tomogram of the patient 1 shown in FIG. 5B is to be obtained, that is, the position $x_1$ corresponding to the slice plane 31, is expressed by $(B+G_{s1} \cdot x_1)$. The Larmor frequency $f_1$ of the nuclear spin at this position $x_1$ is expressed by the following equation (1):

$$f_1 = \gamma \cdot (B + G_{s1} \cdot x_1)/2\pi \qquad (1)$$

where Y is a gyromagnetic rotation ratio of an object nucleid.

Accordingly, the frequency of the first RF pulse applied with the application of the gradient magnetic field $G_{s1}$, that is, the 90° RF pulse 102, is $f_1$. When this 90° RF pulse 102 having the frequency $f_1$ and the first gradient magnetic field as the superposition of the static magnetic field B and the gradient magnetic field $G_{s1}$ are applied, the nuclear spin inside a homogeneous static magnetic field region, that is, inside a plane of a position $x_2$ outside a gradient magnetic field having linearity, is also excited besides the position $x_1$ as shown in FIG. 5A. For, when the static magnetic field B comes off from the spherical space having the radius r from the origin 0 as shown in FIG. 4, the intensity of the magnetic field becomes gradually lower, so that when the gradient magnetic field $G_{s1}$ is superposed with the static magnetic field B, a magnetic field portion represented by the gradient magnetic field portion having linearity and a curve in FIG. 5A is formed, and the position corresponding to the frequency $f_1$ becomes two, i.e. $x_1$ and $x_2$.

The above corresponds to the first step of the present invention.

When the application of the 90° RF pulse 102 is terminated, the excited nuclear spin returns to the original state through transverse relaxation and vertical relaxation.

After the application of the 90° RF pulse 102 and the slicing direction gradient magnetic field $G_{s1}$ 101 is completed, the SE method applies the gradient magnetic fields in two directions orthogonally crossing mutually inside the slice plane in order to impart position identification data to the excited nuclear spin. One of them is the phase encode gradient magnetic field $G_p$ 103, and this provides a phase difference corresponding to the position to the nuclear spin excited by the first step described above. The other is a frequency encode gradient magnetic field $G_f$ 104 in a direction orthogonally crossing the phase encode direction. This provides a dephase with respect to a position in a signal readout direction to the nuclear spin so that the peak of the signal occurs at a certain point of time during the signal readout operation. In the MRI apparatus, an aspect ratio of pixels of a tomogram is set to 128×128, 256×256, etc, and in this case, 128 or 256 different gradient magnetic fields are applied in the phase encode direction and the pulse sequence shown in FIG. 3 is executed. The step of the phase encode gradient magnetic field $G_p$ 103 in FIG. 3 shows this step.

The gradient magnetic fields $G_p$ 103 and $G_f$ 104 are released at the point of time when the unidirectional position data is imparted to the nuclear spin inside the patient 1 excited by the first step as described above, and then the procedure proceeds to the second step as the features of the present invention. In the SE method, this second step is carried out at the stage where the nuclear spin is further excited by 180°. The SE method detects spin echo signals but no FID signals. To obtain a signal (spin echo signal) to which the nuclear spin excited by 90° and provided with the phase data given by the application of the gradient magnetic fields $G_p$ 103, $G_f$ 104, the nuclear spin excited by 90° and having the application data of the gradient magnetic fields $G_p$ 103, $G_f$ 104 is rephased, is further excited by 180°.

At this time, in order to allow the nuclear spin excited by 180° to occur only from inside the slice plane 31 of the patient 1, the slicing direction gradient magnetic field $G_s$ 105 and the 180° RF pulse 106 are applied simultaneously. According to the prior art method, the gradient magnetic field $G_s$ at this time has the same gradient as the one applied at the first step described above and hence, the frequency of the 180° RF pulse is the same as that of the first step. According to this method, however, the nuclear spins of the slice planes 31 and 32 inside the patient corresponding to both of the positions $x_1$ and $x_2$ are excited further by 180°, and the signals from the slice planes 31 and 32 are detected at the time of signal readout. The signal from the slice plane 32 becomes an artifact on the reconstructed image. Accordingly, the present invention employs selective excitation so that only the nuclear spin inside the slice plane 31 can generate the spin echo signal.

Accordingly, the second step applies the slicing direction gradient magnetic field $G_s$ with a different gradient $S_{s2}$ from that ($G_{s1}$) of the first step. Then, the intensity of the magnetic field at the position $x_1$ by the gradient magnetic field at this time is expressed by $(B+G_{s2}.x)$ because the static magnetic field is B. The Larmor frequency $f_2$ by this magnetic field intensity is expressed by the following equation (2):

$$f_2 = \gamma.(B+G_{s2}.x_1)/2\pi \quad (2)$$

Accordingly, the frequency of the 180° RF pulse 106, too, is set to $f_2$.

When the 180° RF pulse 106 having this frequency $f_2$ is irradiated under the application of the slicing direction magnetic field $G_{s2}$ 105 and the static magnetic field B, the internal nuclear spins in the slice planes 31 and 33 inside the patient 1 corresponding to the positions $x_1$ and $x_2$, respectively, are excited by 180° for the same reason as described with reference to the first step. The nuclear spin in the slice plane 31 is excited by 90° by the selective excitation of the first step. Accordingly, it is excited by 270° in total. Since the nuclear spin inside the slice plane 33 is not excited at the first step, on the other hand, it is excited only in the opposite direction (180°) to the direction of the static magnetic field. The above is the second step.

Here, the application of the slicing direction gradient magnetic field $G_{s2}$ 105 in this embodiment will be explained briefly. According to the SE method, etc, rephasing of the nuclear spin resulting from the difference of the gradient magnetic fields inside the slice thickness is generally carried out by reversing the slicing direction gradient magnetic field $G_{s1}$ after the irradiation of the 90° Rf pulse during the slice selective excitation at the first step. In this embodiment, this technique is added to the second step. In other words, the slice direction gradient magnetic field $G_{s2}$ 105 may be applied only during the irradiation period of the 180° RF pulse 106 solely for the purpose of the slice selection. However, it is applied additionally for the period $\Delta t$ after completion of the irradiation of the 180° Rf pulse 106 in this embodiment so as to effect rephasing described above. Since the nuclear spin is reversed by the 180° RF pulse, the rephase can be made by the pulse in the positive direction. Setting of the time $\Delta t$ can be made by calculation and by trace experiments of the calculation result. When this method is employed, inversion of the slicing direction gradient magnetic field at the first step according to the prior art method can be eliminated, so that the pulse sequence as well as the apparatus configuration can be simplified.

Due to the selective excitation at the first and second steps, the nuclear spins in the slice plane of the patient 1 are excited in the following way; that is, 270° inside the slice plane 31, 90° in the slice plane 32 and 180° in the slice plane 33.

According to the SE method, the NMR signal, i.e. the spin echo signal 108, is detected under the state where the frequency encode gradient magnetic field $G_f$ 107 is kept applied, after the second step is completed. The signal detected at this time is the signal resulting from the rotation of the nuclear spin inside the slice plane 31 and is the signal which is dephased after the 90° excitation and is then rephased by the 180° excitation. Therefore, this signal is referred to as a "spin echo signal". No signals are detected from the slice planes 32 and 33. For, the nuclear spin inside the slice plane 32 receives only the 90° excitation but does not receive the 180° excitation. Accordingly, it does not become an echo signal but is dephased by the gradient magnetic fields $G_f$ 104, 107 shown in FIG. 3, so that the signal virtually disappears and no signal is generated from the nuclear spin excited by 180° inside the slice plane 33.

Assuming that the imaging field is represented by N pixels in the frequency encode direction, the frequency encode gradient magnetic field $G_f$ at the time of reading of the spin echo signal provides relatively the difference of N cycles to the rotation of the nuclear spin at both ends of the imaging field. Accordingly, the position of the nuclear spin in the frequency encode direction can be identified by the frequency. When the frequency encode gradient magnetic field $G_f$ is applied, the spin echo signal appears in the waveform added by the FID signal, and its peak occurs after the passage of the time $t_f$ from the application of the frequency encode gradient magnetic field $G_f$ for signal readout with $t_f$ representing the application period of the frequency encode gradient magnetic field applied at the time of phase encode. This echo signal is detected by the RF coil 20b on the reception side, is amplified by the amplifier 23 and is inputted to the quadrature phase detector 24.

The quadrature phase detector 24 is so controlled as to synchronize with the output signal of the RF oscillator 17, shapes the waveform of the input RF signal, separates it into signals of two components, i.e. a sin component and a cos component, and outputs them. These two components of signals are inputted to the A/D convertor 25. The A/D convertor 25 samples the two components of the signals thus inputted in accordance with the instruction of the sequencer 12. The two components of the digital signals outputted are inputted to the CPU 11 and are used there as the real part data and the imaginary part data of the Fourier transform, but are once stored in a memory device, not shown, inside the CPU 11.

Two-dimensional imaging according to the SE method iterates the pulse sequence shown in FIG. 3 while changing step by step the phase encode quantity and takes in the spin echo signal. An image is then reconstructed by effecting two-dimensional Fourier transform by the use of these data, and is displayed on the display unit 28.

As described above, the present invention selectively excites the nuclear spin at a specific portion by the first and second steps, and in the case of two-dimensional imaging, the slice thickness naturally bears relation in the excitation. According to the prior art, the slicing direction gradient magnetic field and the frequency of the RF pulse are set to the same values between the first and second step selective excitations. Accordingly, the frequency band width of the RF pulse becomes the same band width in such a manner as to correspond to a desired slice thickness. In the present invention, however, the slicing direction gradient magnetic fields are different between the first and second steps, and the difference develops between the band widths of the 90° RF pulse (first RF pulse) and 180° RF pulse (second RF pulse) for exciting the region having a desired slice thickness.

Figure 6:
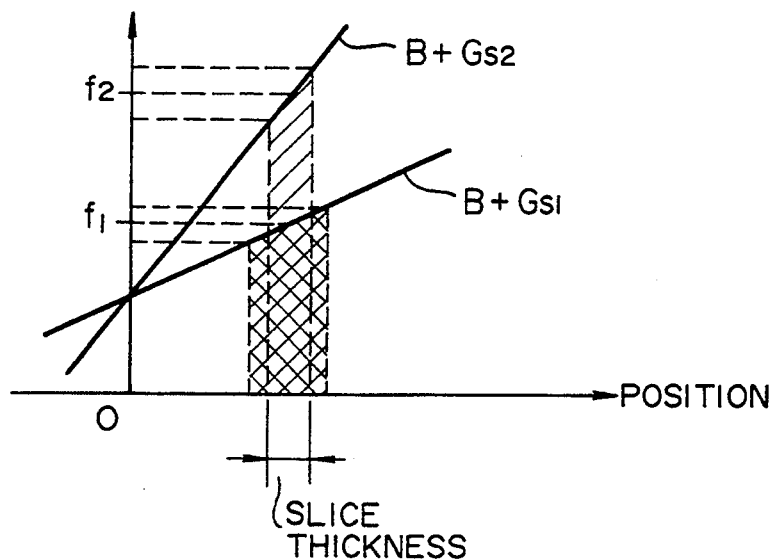
FIGS. 6 and 7 are explanatory views useful for explaining setting of a slice thickness in another embodiment of the present invention.
Figure 7:
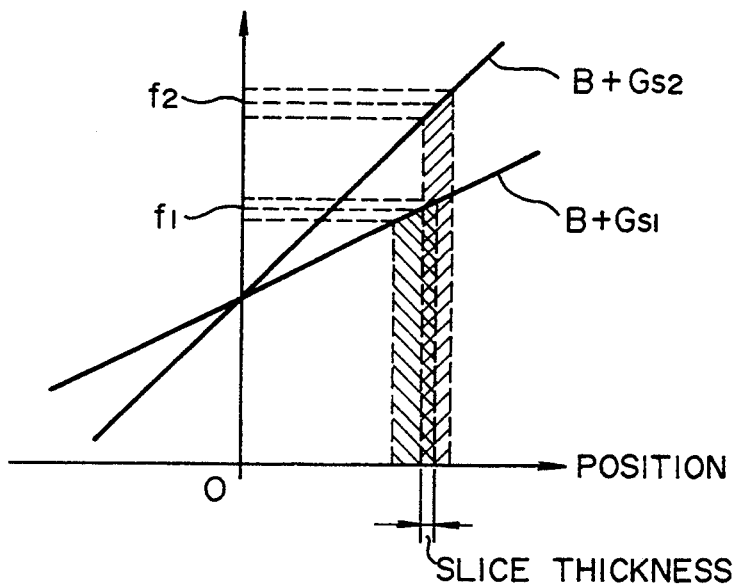

The embodiment given above has been explained with reference to the method which lets the band widths of the first and second RF pulses correspond to a desired slice thickness, but the present invention can also adopt a setting method of the band width such as shown in FIG. 6. This method so sets the frequency band width of either one of the first and second RF pulses as to provide a desired slice thickness, and sets the frequency band of the other to a band width corresponding to a greater slice thickness within the range in which the gradient magnetic field keeps linearity. In this case, only the portion at which the two frequency band widths overlap with each other receives excitation for generating the echo signal. It is possible, for example, to have the slicing direction gradient magnetic field having a greater gradient correspond to the RF pulse of the band width for setting the slice thickness. Furthermore, the first and second RF pulses may partially overlap with each other as shown in FIG. 7. These methods can improve freedom in setting the slice thickness.

Next, the frequency of each of the first and second RF pulses will be explained further. In the embodiment wherein the present invention is applied to the SE method, the 90° RF pulse and the 180° RF pulse have mutually different frequencies, but there is the case where the same frequency is used. Generally, a gradient magnetic field is generated by causing currents to flow through two coils in opposite directions, and it is "positive" in one of the directions and "negative" in the other. The gradient magnetic field is "zero" between them. When this gradient magnetic field is superposed with the static magnetic field, the "zero" point of this gradient magnetic field is brought into conformity with the center of the homogeneous static magnetic field $B_o$. Since this principle remains unchanged even when the intensity of the gradient magnetic field is changed, the intensity of the gradient magnetic field at the "zero" point is, after all, the homogeneous static magnetic field $B_o$. Accordingly, in order to excite the nuclear spin on the slice plane inside the patient corresponding to this position, the first and second RF pulses have the same frequency even when the intensity of the slicing direction gradient magnetic field is changed.

Although the present invention has thus been explained about the application of the SE method, the present invention can be applied to a pulse sequence to which the SE method is applied. For example, the present invention can be applied to an inversion recovery method (IR method) having a 180°-90°-180° pulse sequence, a multi-echo method using a 90°-180°-180°-180° sequence or a high speed SE method applying the multiecho method.

We claim:

1. A selective excitation method of nuclear spins in a magnetic resonance imaging comprising:
   (a) a first step of applying a first gradient magnetic field $(B+G_{s1})$ at a first intensity to a patient in a predetermined direction, and exciting nuclear spins in a first slice selection region of said patient by a first radio frequency pulse; and
   (b) a second step of applying a second gradient magnetic field $(B+G_{s2})$ at a second intensity different in intensity from said first gradient magnetic field $(B+G_{s1})$ in said predetermined direction after said first step, and exciting nuclear spins in a second slice selection region overlapping at least partially with said first slice selection region by irradiating a second radio frequency pulse, said first intensity and said second intensity of said first and second gradient magnetic fields being determined so that a first portion of said patient excited by said first radio frequency pulse in an undesired region of said patient and a second portion of said patient excited by said second radio frequency pulse in said undesired region of said patient do not overlap.

2. A selective excitation method as claimed in claim 1, wherein said second step includes a step of setting a frequency of said second radio frequency pulse to a frequency different from a frequency of said first radio frequency pulse.

3. A selective excitation method as claimed in claim 1, wherein said second step includes a step of setting a frequency of said second radio frequency pulse to a same frequency as a frequency of said first radio frequency pulse.

4. A selective excitation method as claimed in claim 1, wherein bandwidths of said first and second radio frequency pulses are selected so that one of said first and second slice selection regions is contained in the other.

5. An MRI apparatus comprising:
   (1) a static field generating means for generating a static magnetic field (B) having a nearly homogeneous value $B_o$ in a predetermined space region in which a patient to be inspected is laid;
   (2) a gradient field generating means for generating gradient magnetic fields $(G_s, G_p, G_f)$ in three axes-directions in said predetermined space region;
   (3) a radio frequency pulse generation means for generating a first radio frequency pulse and a second radio frequency pulse for exciting nuclear spins in a slice portion of said patient;
   (4) a controlling means for controlling said gradient magnetic fields and said radio frequency pulse generation means, said controlling means controlling said gradient magnetic fields and generation of said first radio frequency pulse and said second frequency pulse such that when said nuclear spins in said slice portion is first excited, a first gradient magnetic field $(B+G_{s1})$ having a first intensity and said first radio frequency pulse having a first frequency are applied to said patient so as to excite said slice portion in a first slice width, and when said slice portion is excited secondly, a second gradient magnetic field $(B+G_{s2})$ having a second intensity which is different from said first intensity and said second radio frequency pulse having a second frequency are applied to said patient so as to excite said slice portion in a second slice width, whereby said first slice width and said second slice width are so controlled as to overlap at least partially with each other, said first intensity and said second intensity of said first and second gradient magnetic fields being determined so that a first portion of said patient excited by said first radio frequency pulse in an undesired region of said patient and a second portion of said patient excited by said second radio frequency pulse in said undesired region of said patient do not overlap;

(5) a measuring means for measuring NMR signals;

(6) a reconstructing means for reconstructing an image from said NMR signals measured; and (7) a displaying means for displaying said image.

6. An MRI apparatus as claimed in claim 5, wherein said controlling means includes a bandwidth means for controlling bandwidths of said first and second radio frequency pulses so that either one of said first slice width and said second slice width is contained in the other.

7. A selective excitation method of nuclear spins in a magnetic resonance imaging comprising:

(a) a first step of applying a first gradient magnetic field $(B+G_{s1})$ at a first intensity to a patient in a predetermined direction, and exciting nuclear spins in a first slice selection region of said patient by a first radio frequency pulse; and (b) a second step of applying a second gradient magnetic field $(B+G_{s2})$ at a second intensity different in intensity from said first gradient magnetic field $(B+G_{s1})$ in said predetermined direction after said first step, and exciting nuclear spins in a second slice selection region overlapping at least partially with said first slice selection region by irradiating a second radio frequency pulse, said first intensity and said second intensity of said first and second gradient magnetic fields being determined so that a first portion of said patient excited by said first radio frequency pulse in an undesired region of said patient and a second portion of said patient excited by said second radio frequency pulse in said undesired region of said patient do not overlap, whereby NMR echo signals to be measured are obtained from an overlapping region of said first slice selection region and said second slice selection region.

8. A selective excitation method as claimed in claim 1, wherein said second gradient magnetic field $(B+G_{s2})$ is applied for a predetermined length of time longer than a length of time for which said first gradient magnetic field $(B+G_{s1})$ is applied.

9. An MRI apparatus as claimed in claim 5, wherein said second radio frequency pulse is set to a frequency different from a frequency of said first radio frequency pulse.

10. An MRI apparatus as claimed in claim 5, wherein said second radio frequency pulse is set to a same frequency as a frequency of said first radio frequency pulse.

11. An MRI apparatus as claimed in claim 5, wherein said controlling means causes said second gradient magnetic field $(B+G_{s2})$ to be applied for a predetermined length of time longer than a length of time for which said first gradient magnetic field $(B+G_{s1})$ is applied.

12. A selective excitation method of exciting nuclear spins in a predetermined slice in a magnetic resonance imaging process, said method comprising the steps of:

(a) a first step of applying a first gradient magnetic field $(B+G_{s1})$ at a first intensity to an object in a predetermined direction, and exciting nuclear spins in said predetermined slice of said object by a first radio frequency pulse; and (b) a second step of applying a second gradient magnetic field $(B+G_{s2})$ at a second intensity different in intensity from said first gradient magnetic field $(B+G_{s1})$ in said predetermined direction after said first step, and exciting nuclear spins in said predetermined slice of said object by a second radio frequency pulse, wherein one of said first radio frequency pulse and said second radio frequency pulse also excites nuclear spins in an artifact slice of said object, said artifact slice including regions of said object not included within said predetermined slice, wherein said predetermined slice, having nuclear spins excited by said first radio frequency pulse and further excited by said second radio frequency pulse, has nuclear spins selectively excited for production of an NMR echo signal, and wherein said artifact slice, having nuclear spins excited only by one of said first radio frequency pulse and said second radio frequency pulse, does not have nuclear spins excited for production of an NMR echo signal.

13. An MRI apparatus applying selective excitation of nuclear spins in a predetermined slice in a magnetic resonance imaging reproduction process, said apparatus comprising:

(1) a static field generating means for generating a static magnetic field (B) having a nearly homogeneous value $B_o$ in a predetermined space region in which an object to be inspected is laid;

(2) a gradient field generating means for generating gradient magnetic fields $(G_s, G_p, G_f)$ in three axes-directions in said predetermined space region;

(3) a radio frequency pulse generation means for generating a first radio frequency pulse and a second radio frequency pulse for selectively exciting nuclear spins in a predetermined slice of said object;

(4) a controlling means for controlling said gradient magnetic fields and said radio frequency pulse generation means, said controlling means controlling said gradient magnetic fields and generation of said first radio frequency pulse and said second radio frequency pulse such that when said nuclear spins in said predetermined slice is first excited, a first gradient magnetic field $(B+G_{s1})$ having a first intensity and said first radio frequency pulse are applied to said object so as to excite said predetermined slice, and when said predetermined slice is excited secondly, a second gradient magnetic field $(B+G_{s2})$ having a second intensity which is different from said first intensity and said second radio frequency pulse are applied to said object so as to excite said predetermined slice, wherein one of said first radio frequency pulse and said second radio frequency pulse also excites nuclear spins in an artifact slice of said object, said artifact slice including regions of said object not included within said predetermined slice, wherein said predetermined slice, having nuclear spins excited by said first radio frequency pulse and further excited by said second radio frequency pulse, has nuclear spins selectively excited for production of an NMR echo signal, and wherein said artifact slice, having nuclear spins excited only by one of said first radio frequency pulse and said second radio frequency pulse, does not have nuclear spins excited for production of an NMR echo signal;

(5) a measuring means for measuring NMR echo signals;

(6) a reconstructing means for reconstructing an image from said NMR echo signals measured; and (7) a displaying means for displaying said image.

14. A selective excitation method of exciting nuclear spins in a predetermined slice in a magnetic resonance imaging process, said method comprising the steps of:

(a) a first step of applying a first gradient magnetic field $(B+G_{s1})$ at a first intensity to an object in a predetermined direction, and exciting nuclear spins in said predetermined slice and a first artifact slice of said object by a first radio frequency pulse; and (b) a second step of applying a second gradient magnetic field $(B+G_{s2})$ at a second intensity different in intensity from said first gradient magnetic field $(B+G_{s1})$ in said predetermined direction after said first step, and exciting nuclear spins in said predetermined slice and a second artifact slice of said object by a second radio frequency pulse, wherein said predetermined slice, having nuclear spins excited by said first radio frequency pulse and further excited by said second radio frequency pulse, has nuclear spins selectively excited for production of an NMR echo signal, and wherein said first artifact slice and said second artifact slice, having nuclear spins excited by said first radio frequency pulse and said second radio frequency pulse, respectively, do not have nuclear spins excited for production of an NMR echo signal.

15. An MRI apparatus applying selective excitation of nuclear spins in a predetermined slice in a magnetic resonance imaging reproduction process, said apparatus comprising:

(1) a static field generating means for generating a static magnetic field (B) having a nearly homogeneous value $B_o$ in a predetermined space region in which an object to be inspected is laid;

(2) a gradient field generating means for generating gradient magnetic fields $(G_s, G_p, G_f)$ in three axes-directions in said predetermined space region;

(3) a radio frequency pulse generation means for generating a first radio frequency pulse and a second radio frequency pulse for selectively exciting nuclear spins in a predetermined slice of said object;

(4) a controlling means for controlling said gradient magnetic fields and said radio frequency pulse generation means, said controlling means controlling said gradient magnetic fields and generation of said first radio frequency pulse and said second radio frequency pulse such that a first gradient magnetic field $(B+G_{s1})$ having a first intensity and said first radio frequency pulse are applied to said object so as to excite said predetermined slice and a first artifact slice, and then a second gradient magnetic field $(B+G_{s2})$ having a second intensity which is different from said first intensity and said second radio frequency pulse are applied to said object so as to excite said predetermined slice and a second artifact slice, wherein said predetermined slice, having nuclear spins excited by said first radio frequency pulse and further excited by said second radio frequency pulse, has nuclear spins selectively excited for production of an NMR echo signal, and wherein said first artifact slice and said second artifact slice, having nuclear spins excited by said first radio frequency pulse and said second radio frequency pulse, respectively, do not have nuclear spins excited for production of an NMR echo signal;

(5) a measuring means for measuring NMR echo signals;

(6) a reconstructing means for reconstructing an image from said NMR echo signals measured; and (7) a displaying means for displaying said image.

16. A selective excitation method of exciting nuclear spins in a predetermined slice in a magnetic resonance imaging process, said method comprising the steps of:

(a) a first step of applying a first gradient magnetic field $(B+G_{s1})$ at a first intensity to an object in a predetermined direction, and exciting nuclear spins in said predetermined slice of said object by a first radio frequency pulse having a first frequency; and (b) a second step of applying a second gradient magnetic field $(B+G_{s2})$ at a second intensity different in intensity from said first gradient magnetic field $(B+G_{s1})$ in said predetermined direction after said first step, and exciting nuclear spins in said predetermined slice of said object by a second radio frequency pulse having a second frequency which is different from said first frequency, wherein one of said first radio frequency pulse and said second radio frequency pulse also excites nuclear spins in an artifact slice of said object, said artifact slice including regions of said object not included within said predetermined slice, wherein said predetermined slice, having nuclear spins excited by said first radio frequency pulse at said first frequency and further excited by said second radio frequency pulse at said second frequency, has nuclear spins selectively excited and rephased with respect to a predetermined phase bandwidth for production of an NMR echo signal, and wherein said artifact slice, having nuclear spins excited only by one of said first radio frequency pulse at said first frequency and said second radio frequency pulse at said second frequency, does not have nuclear spins excited and rephased with respect to said predetermined phase bandwidth for production of an NMR echo signal.

17. An MRI apparatus applying selective excitation of nuclear spins in a predetermined slice in a magnetic resonance imaging reproduction process, said apparatus comprising:

(1) a static field generating means for generating a static magnetic field (B) having a nearly homogeneous value $B_o$ in a predetermined space region in which an object to be inspected is laid;

(2) a gradient field generating means for generating gradient magnetic fields ($G_s$, $G_p$, $G_f$) in three axes-directions in said predetermined space region;

(3) a radio frequency pulse generation means for generating a first radio frequency pulse and a second radio frequency pulse for selectively exciting nuclear spins in a predetermined slice of said object;

(4) a controlling means for controlling said gradient magnetic fields and said radio frequency pulse generation means, said controlling means controlling said gradient magnetic fields and generation of said first radio frequency pulse and said second radio frequency pulse such that when said nuclear spins in said predetermined slice is first excited, a first gradient magnetic field ($B+G_{s1}$) having a first intensity and said first radio frequency pulse having a first frequency are applied to said object so as to excite said predetermined slice, and when said predetermined slice is excited secondly, a second gradient magnetic field ($B+G_{s2}$) having a second intensity which is different from said first intensity and said second radio frequency pulse having a second frequency which is different from said first frequency are applied to said object so as to excite said predetermined slice, wherein one of said first radio frequency pulse and said second radio frequency pulse also excites nuclear spins in an artifact slice of said object, said artifact slice including regions of said object not included within said predetermined slice, wherein said predetermined slice, having nuclear spins excited by said first radio frequency pulse at said first frequency and further excited by said second radio frequency pulse at said second frequency, has nuclear spins selectively excited and rephased with respect to a predetermined phase bandwidth for production of an NMR echo signal, and wherein said artifact slice, having nuclear spins excited only by one of said first radio frequency pulse at said first frequency and said second radio frequency pulse at said second frequency, does not have nuclear spins excited and rephased with respect to said predetermined phase bandwidth for production of an NMR echo signal;

(5) a measuring means for measuring NMR echo signals;

(6) a reconstructing means for reconstructing an image from said NMR echo signals measured; and (7) a displaying means for displaying said image.

18. A selective excitation method of exciting nuclear spins in a predetermined slice in a magnetic resonance imaging process, said method comprising the steps of:

(a) a first step of applying a first gradient magnetic field ($B+G_{s1}$) at a first intensity to an object in a predetermined direction, and exciting nuclear spins in said predetermined slice and a first artifact slice of said object by a first radio frequency pulse having a first frequency; and (b) a second step of applying a second gradient magnetic field ($B+G_{s2}$) at a second intensity different in intensity from said first gradient magnetic field ($B+G_{s1}$) in said predetermined direction after said first step, and exciting nuclear spins in said predetermined slice and a second artifact slice of said object by a second radio frequency pulse having a second frequency which is different from said first frequency, wherein said predetermined slice, having nuclear spins excited by said first radio frequency pulse at said first frequency and further excited by said second radio frequency pulse at said second frequency, has nuclear spins selectively excited and rephased with respect to a predetermined phase bandwidth for production of an NMR echo signal, and wherein said first artifact slice and said second artifact slice, having nuclear spins excited only by said first radio frequency pulse and said second radio frequency pulse, respectively, do not have nuclear spins excited and rephased with respect to said predetermined phase bandwidth for production of an NMR echo signal.

19. An MRI apparatus applying selective excitation of nuclear spins in a predetermined slice in a magnetic resonance imaging reproduction process, said apparatus comprising:

(1) a static field generating means for generating a static magnetic field (B) having a nearly homogeneous value $B_o$ in a predetermined space region in which an object to be inspected is laid;

(2) a gradient field generating means for generating gradient magnetic fields ($G_s$, $G_p$, $G_f$) in three axes-directions in said predetermined space region;

(3) a radio frequency pulse generation means for generating a first radio frequency pulse at a first frequency and a second radio frequency pulse at a second frequency for selectively exciting nuclear spins in a predetermined slice of said object;

(4) a controlling means for controlling said gradient magnetic fields and said radio frequency pulse generation means, said controlling means controlling said gradient magnetic fields and generation of said first radio frequency pulse and said second radio frequency pulse such that a first gradient magnetic field ($B+G_{s1}$) having a first intensity and said first radio frequency pulse having said first frequency are applied to said object so as to excite said predetermined slice and a first artifact slice, and then a second gradient magnetic field ($B+G_{s2}$) having a second intensity which is different from said first intensity and said second radio frequency pulse having said second frequency are applied to said object so as to excite said predetermined slice and a second artifact slice, wherein said predetermined slice, having nuclear spins excited by said first radio frequency pulse at said first frequency and further excited by said second radio frequency pulse at said second frequency, has nuclear spins selectively excited and rephased with respect to a predetermined phase bandwidth for production of an NMR echo signal, and wherein said first artifact slice and said second artifact slice, having nuclear spins excited only by said first radio frequency pulse and said second radio frequency pulse, respectively, do not have nuclear spins excited and rephased with respect to said predetermined phase bandwidth for production of an NMR echo signal;

(5) a measuring means for measuring NMR echo signals;

(6) a reconstructing means for reconstructing an image from said NMR echo signals measured; and (7) a displaying means for displaying said image.

* * * * *

UNITED STATES PATENT AND TRADEMARK OFFICE
CERTIFICATE OF CORRECTION

PATENT NO. : 5,386,190
DATED : January 31, 1995
INVENTOR(S) : Hiroyuki TAKEUCHI and Katsunori SUZUKI It is certified that error appears in the above-identified patent and that said Letters Patent is hereby corrected as shown below:

On the title page, item [73] insert:

Hitachi Medical Corporation, Tokyo, Japan

Signed and Sealed this

Fourth Day of July, 1995

Attest:

BRUCE LEHMAN

Attesting Officer     Commissioner of Patents and Trademarks